U.S. Patent Number: 4,717,632
Date of Patent: Jan. 5, 1988

Keem et al.

[54] ADHESION AND COMPOSITE WEAR RESISTANT COATING AND METHOD

[75] Inventors: John E. Keem, Birmingham; James D. Flasck, Rochester; Richard W. Seguin, Milford, all of Mich.

[73] Assignee: Ovonic Synthetic-Materials Company, Inc., Troy, Mich.

[21] Appl. No.: 895,530

[22] Filed: Aug. 11, 1986

Related U.S. Application Data

[63] Continuation of Ser. No. 525,100, Aug. 22, 1983, abandoned.

[51] Int. Cl.$^4$ .................. B32B 9/04; B32B 13/04; B32B 9/00; B32B 19/00
[52] U.S. Cl. ................................. 428/698; 428/699; 428/469; 428/472
[58] Field of Search ............... 428/698, 699, 446, 192, 428/333, 336; 51/307, 309; 427/34

[56] References Cited

U.S. PATENT DOCUMENTS

| | | | |
|---|---|---|---|
| Re. 28,485 | 7/1975 | Rix et al. | 429/698 |
| 3,774,703 | 11/1973 | Sanderson | 204/192 R |
| 4,447,263 | 5/1984 | Sugizawa et al. | 428/699 X |
| 4,522,844 | 6/1985 | Khanna et al. | 427/47 X |
| 4,594,294 | 6/1986 | Eichen et al. | 428/698 X |
| 4,608,297 | 8/1986 | Shimada et al. | 428/698 X |
| 4,619,865 | 10/1986 | Keem et al. | 428/698 X |

FOREIGN PATENT DOCUMENTS 3127346  1/1983  Fed. Rep. of Germany .

OTHER PUBLICATIONS

Patent Abstracts of Japan, The Patent Office, Japanese Government, unexamined applications, P field, vol. 6, No. 70, May 6, 1980, p. 163P113, Kokai-No. 57-11 319, (Toyo).
Patent Abstracts of Japan, The Patent Office, Japanese Government, unexamined applications, P field, vol. 4, No. 47, Apr. 11, 1980, Kokai-No. 55-17 135, (Teijin).

Primary Examiner—Nancy A. B. Swisher
Attorney, Agent, or Firm—Richard M. Goldman; Marvin S. Siskind

[57] ABSTRACT

Adherence coatings and methods for forming same are provided. Generally, the adherence coatings are utilized in combination with exterior wear-resistant coatings of, for example, at least one non-metallic element and a transition metal.

The composition of the adherence coating is selected on the basis of the substrate and exterior coating compositions and generally contain one or more metallic elements. The adherence coating can be applied by sputtering, desirably in a manner to produce a columnar microstructure.

60 Claims, 7 Drawing Figures

ADHESION AND COMPOSITE WEAR RESISTANT COATING AND METHOD

This application is a continuation of application Ser. No. 525,100, filed Aug. 22, 1983, now abandoned.

BACKGROUND

This invention relates to coatings and more particularly to coatings on surfaces that are subjected to friction or wear and to coatings for tools utilized for cutting, forming and grinding.

In the past, tools have been fabricated to achieve various hardness, lubricity and wear characteristics by controlling certain parameters. For example, tools for working and shaping unhardened steels may be fabricated from steel containing enough carbon to form very hard martensite. In more complicated compositions, varying the carbon content and alloy content makes possible non-deforming steels, shock-resistant steels, hot-work steels, or high-speed steels. In some of these steels, alloying elements such as titanium, vanadium, molybdenum, tungsten and chromium are used. These are elements which have a great affinity for carbon and form hard, wear resistant metallic carbides.

Tools are also constructed of materials such as tungsten carbide and other cemented carbides.

In many cases, it is desirable to provide for such tools a coating on the surface thereof to improve the hardness and/or lubricity of the tool. This is especially the case where it is desired to lengthen the tool life or where it is necessary to shape and work hardened steel.

Types of wear resistant coatings are known. However, many types of wear resistant coatings require high temperatures for application, thereby making them impractical for use on many types of substrate materials, since the properties of the substrate may change significantly under such temperatures. Other types of coatings do not adhere well enough to the substrate under working conditions for practical use. As a result, fracture, crumbling and/or delamination of the coating can occur resulting in premature failure.

Thus, a need exists for wear resistant coatings that can be applied at relatively low temperatures to avoid significant change of substrate properties. A need also exists for wear resistant coatings for articles such as tools to provide improved properties of hardness and lubricity thereby resulting in longer tool life and an improved surface finish of parts machined therewith. Further, a need also exists to provide wear resistant coatings that have good adherence to provide resistance to fracturing, delaminating and crumbling, allowing such coatings to have more widespread use.

SUMMARY OF THE INVENTION

In accordance with a broad aspect of the invention, it has been discovered that certain coatings of materials have excellent adherence to surfaces and provide good adherence of overlaying coatings. These coatings which provide good adherence are referred to herein as adherence coatings or layers. Generally, it is contemplated that an exterior coating or coatings will be applied over the adherence layer, the purpose of the exterior coating or layer being for wear resistance and/or lubricity or some other desired characteristic, for example. Thus, the present invention is particularly useful for cutting and forming tools. It is to be understood that the adherence coatings can have beneficial wear resistance and other useful properties without additional coatings and may be used without an exterior coating.

Tools and other articles, particularly those which are subject to wear, such as a result of contact with other surfaces, can be coated with the adherence coatings and thereafter coated, if desired, with an exterior coating or coatings to provide a surface having desired characteristics. The adherence coating provides good adherence of the exterior coating. Generally, the composition of the adherence coating is different from the substrate composition. As used herein, "good adherence" of the exterior coating means that generally the exterior coating will be sufficiently bonded to be useful in wear related applications, such as, for example, where friction is encountered. For example, the exterior coating may be chosen for extreme hardness, wear resistance, lubricity or some other property or combination of properties. The present invention is particularly suited for cutting tools.

The adherence coatings of the invention are suitable for metallic and ceramic substrates, for example, and are applied over the substrate surface. By way of example only, included in these substrates are those which contain tungsten, silicon, titanium, aluminum, iron, and in general, transition metals. In accordance with one embodiment, the adherence coatings contain at least one or more metallic elements and may optionally contain one or more nonmetallic elements from the group of silicon, phosphorous, fluorine, sulfur and chlorine. Fluorine, sulfur and chlorine are generally believed to be less desirable than phosphorous and silicon. Suitable metallic elements may be chosen from, where appropriate, scandium, titanium, vanadium, chromium, yttrium, zirconium, niobium, molybdenum, hafnium, tantalum, aluminum and tungsten. Hydrogen may also be present. Hydrogen can be useful only as a compound with one or more of the foregoing metals (e.g. a metal hydride) or with silicon. Generally, the amount of hydrogen will be on the order of about 10% or less on an atomic basis.

In accordance with another embodiment of the invention, the adherence coating contains silicon without any metallic elements being present. Hydrogen may also be optionally present as a compound or compounds with silicon. Again, the amount of hydrogen which will be present will generally be on the order of about 10% on an atomic basis.

In accordance with one aspect of the invention, adherence coatings are tailor-made for a particular substrate and exterior coating combination. This is accomplished by meeting any one or more of the following requirements for the adherence coating relative to the layers immediately adjacent to the adherence coating. Any of these requirements for one of the adjacent layers can be fulfilled independently of the requirement that is fulfilled for the other adjacent layer. The layers adjacent the adherence coating will generally be the substrate and the exterior coating, although it is envisioned that the substrate may have some other type of coating thereon and that there may be more than one coating over the adherence coating. As used herein, the exterior coating is that coating or layer directly over the adherence coating. The requirements are: (1) the presence of at least one element common to the adherence layer and adjacent layer(s); (2) the presence of at least one element in the adherence layer having about the same atom size as at least one element in the adjacent layer(s); (3) at least one element in the adherence coating composition which, upon migration into the adjacent layer(s) forms a composition in that layer having the same atomic structure as that layer prior to migration; (4) the presence of at least one element in the adherence layer that is soluble in the adjacent layer(s); and (5) the presence of at least one element in the adherence coating that has a high bond energy between at least one element in the adjacent layer(s).

The adherence coating can comprise at least one element, an alloy or a compound that meets one or more of the foregoing requirements relative to a particular substrate and exterior coating.

In accordance with a more specific aspect of the invention, the composition of the adherence coatings comprises at least two elements and meets one or more of the foregoing requirements for each of the adjacent layer(s). By providing an adherence layer with two or more elements, meeting at least one of the foregoing requirements can be facilitated, since one element can fulfill one of the requirements for one layer and the other element can fulfill one of the requirements for the other layer. The two elements may be both metals, or one may be a metal and the other a metalloid selected from the group of fluorine, silicon, phosphorous, sulfur and chlorine. Generally, fluorine, sulfur and chlorine are believed to be less desirable than silicon or phosphorous. The choice of particular elements for the adherence coating is determined by the composition and structure of the layers adjacent the adherence coating (e.g. the substrate and exterior coating). Suitable metal elements may include those chosen from hydrogen, scandium, titanium, vanadium, chromium, yttrium, zirconium, niobium, molybdenum, hafnium, tantalum, aluminum and tungsten, for example. Hydrogen, as previously discussed, may also be present in the adherence coating.

Preferably, for an adherence coating containing more than one element, the elements of the adherence coating have mutual solubility. It is believed that this property reduces any tendencies of the adherence coating to fracture, crumble, delaminate or otherwise fail as a result of local concentration gradients within the coating, for example. Further, such a composition allows migration of the individual components within the coating, which results in concentration gradients or variations, without a corresponding increase in the tendency of the coating to fracture or otherwise fail.

As previously set forth, it is desirable for at least one element of the adherence coating composition to be soluble in the substrate composition and any layer or coating that is adjacent the adherence coating. Preferably, the adherence coating composition has some solubility with the adjacent layers. Thus, where an exterior coating is superposed on the adherence coating, to achieve a desired characteristic, such as resistance to wear or improved lubricity, for example, the adherence coating should preferably have at least one component that is soluble in the exterior coating. Similarly, the adherence coating should preferably have some solubility in the substrate or other adjacent layer. It is believed that this relative solubility property reduces any tendencies of the adherence and exterior coatings to fracture, crumble, delaminate or otherwise fail.

Generally, it is most desirable that the particular component or element of the adherence layer that has solubility in the adjacent layer or substrate, will also be the component or element that has the greatest mobility of the components or elements present in the adherence layer. The term "mobility" as used herein means the tendency of atoms to move or diffuse within a coating or layer.

In selecting the components of the adherence coating and exterior coating compositions, the components can be chosen so that one or more of the previously mentioned requirements are met relative to a particular substrate and adherence and exterior coatings. Thus, at least one component of the adherence coating can be chosen such that it is present in both the substrate and the desired exterior coating. For example, if the substrate contains titanium and the desired exterior coating has titanium, one component or the component of the adherence coating can generally be titanium. When it is said that the substrate or exterior coating contains titanium, this means that titanium is present in more than a trace amount.

Another requirement which may be met matches the relative atom sizes of one or more components in each of the substrate, adherence and exterior compositions. As used herein, atom size refers to metallic radii for a coordination number of twelve. Thus, if molybdenum (atomic radius 1.39Å) is present in the substrate, elements such as tungsten (atomic radius 1.41Å) or zinc (atomic radius 1.38Å) are probably likely to be useful and more likely to be useful than elements such as lead (atomic radius 1.75Å) or yttrium (atomic radius 1.78Å) which do not have relatively equivalent atom sizes to molybdenum.

Still another requirement which may be satisfied in choosing the components of the substrate, adherence and exterior coatings relates to the physical atomic structures of the layers adjacent the adherence coating to the type of structure that would be formed if one or more elements from the adherence coating migrates into the adjacent layer or layers. Generally, elements which would form the same type of physical atomic structure with the adjacent layer after migration therein will be an indication of compatibility between the various compositions of the system. As used herein, the term "physical atomic structure" refers to the structure of the material (e.g. crystalline, disordered, polycrystalline, microcrystalline or amorphous). For example, if the substrate has a face centered cubic structure, an adherence coating of at least one element that would form a face centered cubic structure with the substrate composition would be an indication of a suitable adherence coating.

High bond energies between one or more elements in the adherence coating and at least one element present in the adjacent layer or layers is another requirement which may be satisfied in choosing components and indicates that a strong chemical bond can be formed if there is migration from one layer to the adherence layer or vice versa. As used herein, "high bond energy" means a bond energy of about 40 kcal/mole or more.

It is to be understood that meeting one or more of the foregoing requirements with respect to component selection may not in every case result in a particular selection of components that provide satisfactory adherence for a particular use. However, once a specific component system is selected, it can be easily determined whether the adherence coating will be suitable for a particular application by formulating and testing the coating.

Often, one or more of the components or compositions of the system (substrate, adherence coating and exterior coating (if desired)) will be fixed. For example, it may be that a particular substrate, such as a tool or workpiece is to be coated. Then the composition of the substrate is, of course, fixed. It may be that a particular adherence or exterior coating composition is desired. Then, the remaining components or compositions of the system must be chosen.

Specific examples of substrate, adherence coating and exterior coating systems which may be suitable are set forth in the following table:

TABLE I

| Substrate Composition | Adherence Coating Composition | Exterior Coating Composition |
| --- | --- | --- |
| Tungsten | Ti, W | Mo, B |
| Tungsten Carbide | Ti, W | Ti, O |
| Silicon Nitride | Al, Si | Al, O |
| Ti | Ti, W | Ti, O |
| Silicon Oxide | Si | Ge |
| Silicon Oxide | Si | Al, O |
| Silicon Oxide | Si | Ge, O |
| Ti, W | Ti | Ti, O |
| Ti, W | Ti | Se |

The adherence coating of tungsten and titanium is especially useful in generally improving adherence of molybdenum and boron exterior coating material to tungsten carbide or tool steel substrates. Generally, for the adherence coating, the relative amount of titanium and tungsten on an atomic basis will be from about $Ti_{.05}W_{.95}$ to about $Ti_{.50}W_{.50}$. Preferably, the relative amount will be from about $Ti_{.05}W_{.95}$ to about $Ti_{.20}W_{.80}$ and most preferably about $Ti_{.12}W_{.88}$. Especially useful exterior coating compositions for the titanium-tungsten are the molybdenum-boron compositions hereinafter discussed. An especially preferred molybdenum boron material is disordered $Mo_{0.5}B_{1.0}$.

Stoichiometric or non-stoichiometric compositions for the adherence composition and the exterior composition can be utilized and each may be, independently of each other, crystalline or disordered.

In accordance with one aspect of the invention, a method is provided for selecting suitable substrate, adherence and exterior compositions and for bonding an exterior coating to a substrate. The selection is based upon the previously discussed composition and property requirements, and the adhesion coating is applied by a suitable method over the substrate followed by application of the exterior coating.

In accordance with another aspect of the invention, the adherence coatings are applied in a manner to achieve a desired microstructure. The preferred method for applying the adherence coating depends on the geometry of the surface to which the coating is applied. It is believed that adherence of an exterior coating is improved if the adherence layer has a columnar microstructure or a substantially columnar microstructure. As used herein, substantially means that the microstructure of the material is predominantly columnar. Columnar microstructure is not indicative of the atomic structure of the material. Thus, a material having a columnar microstructure can be, for example, crystalline or disordered.

Any suitable exterior coating, which is different from the adherence coating, can be utilized over the adherence coating. Certain types of disordered wear-resistant coatings are preferred for the exterior coatings. Whether a particular wear resistant coating is suitable depends in part on the particular application for the coated article. Thus, for machine cutting and grinding applications the exterior coating superposed on the adhesion coating should provide the desired characteristics.

The adherence coating should have a thickness sufficient to provide good adherence of the exterior coating. Generally, the thickness of the adherence layer should be from about 500Å to about 2500Å, with about 1000Å being a desirable average thickness within this range. The atomic structure of the adherence coating may be crystalline or disordered.

Preferably, the wear resistant exterior coatings which are utilized over the adherence coating contain a transition metal or alloy thereof (by alloy thereof is meant that the coating can contain more than one transition metal) and at least one non-metallic element. Most preferably, these coatings are disordered. As used herein, "disordered materials" include amorphous, polycrystalline (and lacking long range compositional order), microcrystalline or any combination of those phases. By the term "amorphous" is meant a material which has long range disorder, although it may have short or intermediate order or even contain at times some crystalline inclusions.

For wear resistant coatings, boron is an especially suitable non-metallic element for use in accordance with the invention and carbon, nitrogen and oxygen are examples of other non-metallic elements which may be suitable.

Generally, suitable transition metals for the exterior coating are those of Groups IIIB through VIB, rows 4 through 6, of the periodic table (scandium, titanium, vandium, chromium, yttrium, zirconium, niobium, molybdenum, hafnium, tantalum and tungsten). Especially useful transition metals include molybdenum, yttrium, zirconium, tungsten and alloys thereof. It is anticipated that other transition metals may also be useful for exterior coatings in combination with the adherence coatings.

Tools coated in accordance with the invention utilizing boron as the non-metallic element in the exterior coating generally have excellent hardness and lubricity characteristics which result in increased lifetimes and depending on the particular application, improved surface finishes on parts or workpieces machined therewith.

The disordered exterior coating can be amorphous, polycrystalline (and lacking long range compositional order), microcrystalline or a mixture of any combination of those phases.

A preferred composition of the exterior coating is:

$M_xN_{1-x}$, where "M" represents the transition metal or transition metal alloy, "N" represents the at least one non-metallic element and "x" and "1−x" represent the relative amount of metal and non-metallic element, respectively, present in the coating, "x" being less than one. Preferably, "x" is less than or equal to about 0.5 for coatings containing boron. Thus, included in accordance with the present invention are coatings which are non-stoichiometric as well as those that are.

Advantageously, the exterior coating is disordered when formed. It is believed that disordered wear resistant exterior coatings perform better than single phase crystalline coatings. Disordered coatings may be more susceptible than single phase crystalline coatings to diffusive bonding between the adherence coating surface and the coating, resulting in better adherence. Disordered materials also lack extended lattice planes through which fractures can propagate and in general can withstand relatively high deformation forces without fracture. Such materials are generally less susceptible to corrosion than single phase crystalline materials. It is believed that the foregoing advantages are more fully realized with amorphous or substantially amorphous coatings.

Non-stoichiometric exterior coatings can be utilized over the adherence coating in which the coating composition can be tailor made to achieve desired characteristics while avoiding the formation of extended lattice planes which could adversely affect the adherence, wear resistance or other properties of the coating. Other suitable exterior coatings include carbon, selenium, aluminum oxide, aluminum nitride, germanium and germanium oxide.

The coatings can be applied to a tool surface or substrate surface without significantly changing the dimensions of the tool since the thickness of the coating can be relatively thin and can be closely controlled. After a tool, with or without a coating, has been in use, the adherence coating and other coatings as desired, such as an exterior coating, can be applied thereto, to achieve a desired tolerance or otherwise replace material that has been worn from the tool. Thus, the invention makes possible the reclamation of tools that would otherwise be discarded. This is especially desirable for some types of tools since the tools themselves can be quite expensive.

BRIEF DESCRIPTION OF THE DRAWINGS

The present invention can be more completely understood by reference to the accompanying drawings in which.

DETAILED DESCRIPTION

Once the desired substrate-adherence coating-exterior coating system has been chosen, the adherence coating can be deposited on the substrate. The adherence coatings and exterior coatings are preferably sputter deposited, although any suitable technique can be utilized. Other techniques which may be suitable include other physical vapor deposition methods, such as evaporation and ion plating. Chemical vapor deposition, plasma spraying and electrodeposition processes may also be suitable. Sputtering allows the coatings to be applied at relatively low temperature and is less likely to affect the substrate properties than other techniques which require relatively high temperature.

While sputter depositing techniques are generally known to those skilled in the art, to maximize the benefits of the invention, it is advantageous to form the desired coatings with sputtering techniques that are adapted to the particular geometry of the surface to be coated. Suitable general sputtering techniques, which are set forth as examples and not as limitations on the present invention, include rf diode, rf magnetron and dc magnetron sputtering. If desired, a dc or rf bias may be applied to the substrate during application of the coating by sputtering. The bias may improve adhesion of the coating formed on the substrate, reduce stress in the coating and increase the density of the coating. When applying the adherence coating, the substrate geometry in part determines the most desirable sputtering technique for a particular application.

Prior to sputter depositing, generally it is important to provide an atomically clean surface on the portion of the tool or substrate surface that is to be coated (as used in this specification, "substrate" means that portion of a tool or substrate exclusive of a coating or coatings in accordance with the invention). This facilitates the formation of a uniform coating which adheres to the substrate surface. There are several methods known to those skilled in the art for providing an atomically clean surface for sputtering and any such method may be utilized. The following surface preparation method is provided by way of example only and is not to be construed as a limitation upon the present invention.

In accordance with one method for providing an atomically clean substrate surface, the substrate is degreased with a chlorinated hydrocarbon degreaser. Thereafter, the substrate is rinsed in methanol and is then subjected to either plasma or dry chemical etching. When plasma etching is utilized, preferably a fluorinated carrier gas, such as carbon tetrafluoride is utilized. The carrier gas decomposes and provides fluorine which cleans the substrate surface. The final step for providing an atomically clean surface for the coating is sputter etching in an argon plasma. As an alternative, sputter etching could be used, for example.

After an atomically clean surface has been provided on the substrate or at least on that portion of the substrate which is to be coated, the adherence coating can be applied.

Generally, the adherence coating is applied by sputtering. The preferred sputtering conditions depend on surface geometry and the type of microstructure desired. It is desirable for the adherence coating to have a columnar microstructure. Surface smoothness for the adherence coating is not important. Generally, however, it is desirable for the surface of the exterior coating to be smooth, especially for many wear-related applications. The internal microstructure of the exterior coating may be columnar or non-columnar. For some applications, a columnar surface for the exterior coating can be desirable.

When it is desired to produce a columnar microstructure, any type of sputtering technique known in the art which produces a columnar microstructure can be utilized. One technique for producing a columnar microstructure applies sufficient bias voltage to the substrate to cause formation of the columnar microstructure. For some coating materials and/or substrate geometries, a columnar microstructure may not be formed, even with a high bias voltage. As is known to those skilled in the art, bias sputtering is the process of maintaining a negative voltage bias on the substrate during deposition.

By applying a bias voltage to the substrate, the density, purity, adhesion and internal stress of the coating can be controlled. Generally, application of a bias voltage tends to increase the density, purity and adhesion and also tends to decrease the internal stress of the coating.

The bias voltage applied to a substrate during sputtering may be varied in a desired sequence. The preferred bias sequencing depends on the substrate geometry and the desired microstructure. For complex shapes, or for surfaces having a relatively high (about 2.0 or greater) aspect ratio (which is the ratio of the macroscopic depth to the width of a surface, e.g. the aspect ratio of a planar surface is 0 and the aspect ratio of a surface having a depression whose depth equals its width is 1), it is desirable to initially sputter the adherence material onto the substrate at a relatively low bias voltage (for example, about −100 to −200 volts) to insure complete coverage. Thereafter, the bias voltage is increased to a relatively high bias voltage (for example, about −1000 to −2500 volts). The biasing voltage can be gradually increased (ramp increased) or step increased. Utilizing such a bias voltage tends to promote a more dense, purer coating having greater adhesion, less internal stress and also tends to promote columnar growth. It is believed that a columnar microstructure generally results in better adherence, possibly as a result of mechanical anchoring to the substrate. For the exterior coating on a surface with a high aspect ratio, the bias voltage can be applied as for the adherence coating, except that if a smooth surface is desired, towards the end of the deposition the bias voltage is lowered (for example, generally to about −100 to −200 volts) or eliminated, which tends to allow formation of a smooth surface.

For surfaces having an aspect ratio of about 0.5 to about 2.0, the adherence layer is preferably sputtered at essentially a constant bias voltage, generally between −500 and −1000 volts. A higher voltage can be advantageously used for the adherence coating. For the exterior layer, the bias voltage should be such that a relatively smooth surface is provided.

For surfaces having relatively low aspect ratios (between 0 and about 0.5), preferably the bias voltage initially is higher (about −1000 to −2500 volts) and can be decreased to low voltage (about −100 to −200 volts) in either step or ramp fashion, or eliminated. Again, the decrease or elimination of bias voltage usually applies for the exterior coating, since a smooth surface is not usually desired for the adherence coating. Decreasing or relatively low bias voltage also tends to promote a relatively smooth surface which generally results in a more lubricious surface, which can be desirable in many cases.

Sputter deposited disordered exterior coatings in accordance with the present invention containing boron can result in unexpected beneficial properties including increased resistance to wear and excellent lubricity, to provide an improved surface finish of parts machined herewith.

Since sputtering can take place at relatively low substrate temperatures (generally about 200° C. or less, for example), the coatings can be formed while avoiding significant changes in the properties of the substrate material while providing a surface that has increased resistance to wear and excellent lubricity. Accordingly, the invention is particularly useful for coating materials such as tool steel, tungsten carbide and cemented carbides, graphite, plastics and other substrates that can be adversely affected by elevated temperature, for example, since the processing temperature does not degrade the properties of these materials. Sputtering at low substrate temperatures also allows formation of the coatings in a disordered state. The invention is also suitable for coating precisely dimensional substrates, regardless of substrate composition.

In accordance with one preferred embodiment of the composition and method of the present invention, a coating containing boron and a transition metal or alloy of transition metals is applied over the adherence coating. Such coatings are generally useful to provide wear resistance. Generally, suitable transition metals and alloys include those from Groups IIIB through VIB, rows 4 through 6 of the periodic table. The preferred coatings generally have the composition:

$$M_xB_{1-x},$$

where "x" is less than or equal to about 0.5, "M" is the transition metal or transition metal alloy and "B" is boron. Especially useful transition metals include molybdenum, yttrium, zirconium, tungsten and alloys thereof. It is anticipated that coatings of boron and a transition metal or alloy thereof which are not "disordered" as defined herein are also generally useful as wear resistant coatings, although the disordered exterior coatings are believed to have better properties, as previously described. While coatings having compositions outside of the aforementioned range can be utilized, it is believed that the best combination of hardness and lubricity is generally achieved with coatings having compositions within the range where "x" is less than or equal to about 0.5. As used throughout this specification, the term "lubricity" includes three aspects. One is a measure of friction between the tool and workpiece. The more "lubricious" a coating, the less friction there is between the tool and workpiece. Another aspect of lubricity is referred to as "edge build-up". More lubricious coatings have less of a tendency for chips and particles from the workpiece to adhere to the tool surface. The third aspect of "lubricity" relates to a surface effect at the interface between the tool and workpiece. A coating on the surface of a tool which forms a region at the edge of the workpiece that is compositionally different from the workpiece, such as by diffusion of a portion of the coating into the workpiece edge, can facilitate removal of material from the workpiece by the tool. A desired lubricity of a tool can be achieved by controlling the ratio of metal to boron present in the metal boride coating that is applied to the tool substrate. Generally, it is believed that increasing the amount of boron will increase the lubricity. While not wishing to be bound by theory, one explanation is that when the tool is used, the operating temperatures that are encountered may cause the boron to form an oxide which has a low coefficient of friction.

When it is desired to produce sputtered disordered coatings, generally the sputtering will take place at substrate surface temperatures of less than about 200° C. and usually at about 100° C. or even less, to facilitate formation of disordered coatings. Thus, the coatings in accordance with the present invention can be formed at relatively low temperatures. The target generally is also cooled to prevent evaporation, melting or other unwanted degradation of the target. As a result, the coating is applied to a tool surface, for example, without significantly altering physical properties of the tool, such as the dimensions, hardness and transverse rupture strength. Generally, substrate temperatures, target compositions, deposition rates and gas pressures which tend to prevent the formation of disordered exterior coatings should be avoided when disorder is desired.

It is usually desirable to form an exterior coating that is between about one (1) and about eight (8) micrometers in thickness. However, it is understood that this is merely a preferred embodiment and not a limitation on the invention. Thus, thinner or thicker exterior coatings may be formed to provide optimum results for a particular application. Adherence coatings having a greater thickness may not be particularly desirable in applications where high tolerance must be maintained since the geometry and/or size of the tool and parts resulting therefrom may be altered. The sputtering technique can be chosen in accordance with the guidelines hereinafter set forth relating to relatively simple and complex substrate surface geometries.

It is to be understood that the coatings and methods described herein can be utilized on tools that have been subjected to use, either with or without the coatings described herein. For example, after a tool having a coating or coatings in accordance with the invention has been in use, and is either worn or outside of a desired tolerance range, the same type of coating or another type of coating in accordance with the invention can be applied to the tool, resulting in an increased tool life. Also, a coating can be applied to tools which did not previously have a coating of the invention thereon. Thus, tools which would otherwise be discarded can be reclaimed.

Figure 1:
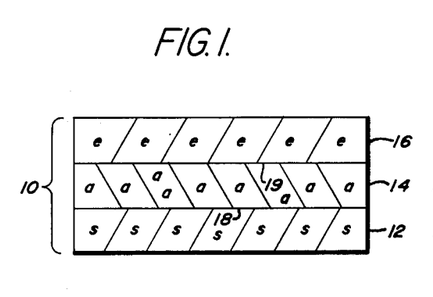
FIG. 1 is a schematic view of a substrate-adherence coating-exterior coating system in accordance with the present invention.

Referring to the figures generally, and in particular to FIG. 1, there is illustrated a schematic diagram of a substrate-adherence coating and exterior coating system 10 in accordance with the invention. System 10 includes a substrate 12, an adherence layer 14 and an exterior layer 16. Substrate 12 may be, for example, part of a tool such as a tool that is used for cutting and grinding. Over substrate 12 has been applied an adherence layer 14.

Figure 2:
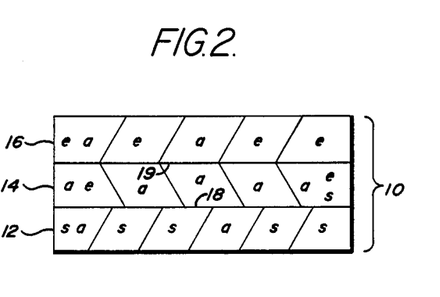
FIG. 2 is a schematic view of the system of FIG. 1 after the system has been in service.

Between substrate 12, adherence layer 14 and exterior layer 16 there are interfaces identified by reference numerals 18 and 19, respectively. The various component or components present in substrate 12, adherence layer 14 and exterior layer 16 are schematically depicted in FIGS. 1 and 2 by the letter "s" as a component in substrate 12, by the letter "a" for a component present in adherence layer 14 and a component of exterior layer 16 is depicted by the letter "e". The system depicted in FIG. 1 shows a typical system prior to use in a cutting or grinding operation, for example. After use in a cutting or grinding operation, the system comprising substrate 12, adherence layer 14 and exterior layer 16 may be transformed to a situation similar to that depicted in FIG. 2. As shown in FIG. 2, some of the components of substrate 12, adherence layer 14 and exterior layer 16, referred to by reference letters s, a, and e, respectively, have migrated across interfaces 18 or 19. When this type of physical phenomena takes place, it is desirable that the components that have migrated across boundary layers 18 and 19 be soluble in their new environment to reduce the tendency of crumbling, fracturing and delaminating of system 10.

Referring now to FIGS. 3–7, several types of tools are illustrated which have been coated in accordance with the present invention.

Figures 3, 5:
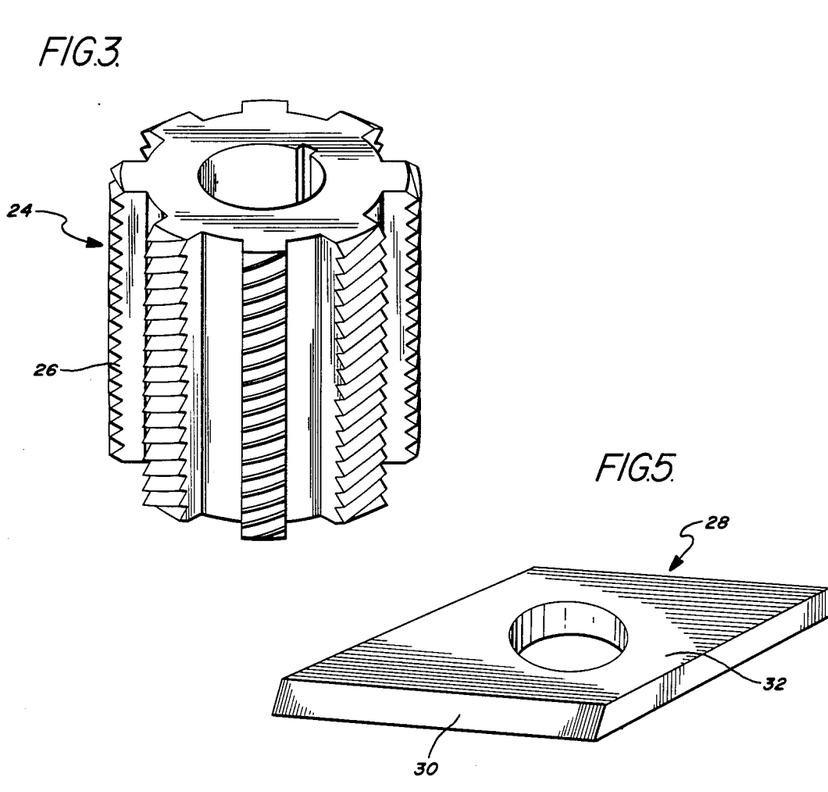
FIGS. 3–7 are perspective views of tools coated in accordance with the present invention.
Figure 4:
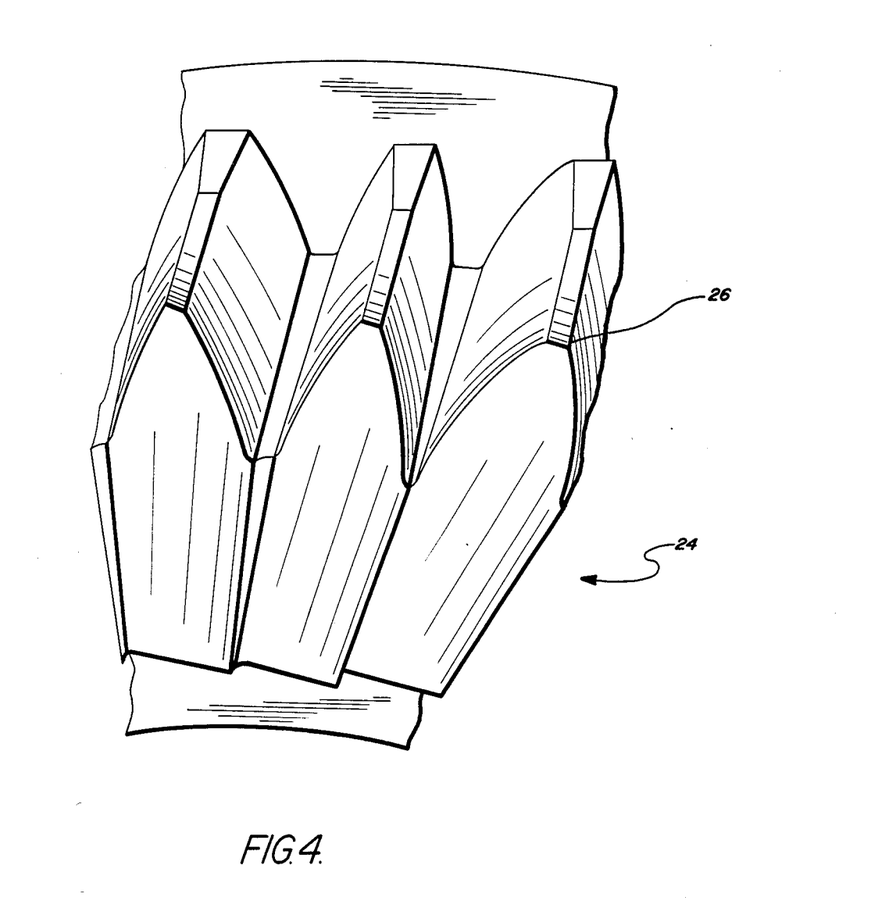

In FIG. 3, there is illustrated a gear hob 24 coated in accordance with the present invention. As shown in FIG. 3, and in greater detail in FIG. 4, gear hob 24 has a plurality of radially extending teeth 26 and is one example of a complex surface.

FIG. 5 is a perspective view of an insert tool 28 having a flank face 30 and a rake face 32. The substrate of insert tool 28 has been coated over its entire surface with an adherence coating of about 90% tungsten and 10% titanium on an atomic basis.

Figure 6:
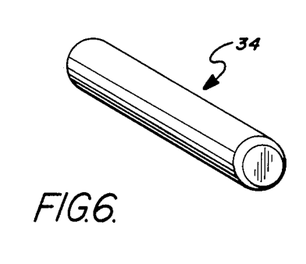

FIG. 6 is a perspective view of a bearing pin 34. Bearing pin 34 is an example of a relatively simple surface.

Figure 7:
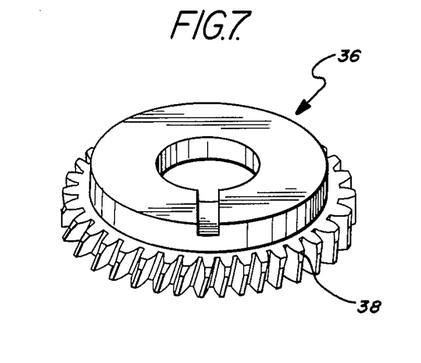

FIG. 7 illustrates a gear shaver tool 36 which is composed of a plurality of radially extending teeth 38. Gear shaver tool 36 illustrates another relatively complexly surfaced tool for which the method and coatings in accordance with the present invention are suitable.

Generally, the hardness of the exterior transition metal non-metallic element coatings is greater than about 1500 Knoop, as measured on crystalline bulk wear resistant coating material with a 1 kilogram force. Since the disordered coatings are relatively thin, direct measurement is impractical and crystalline material is relatively easily made in bulk. It is expected that the material is even harder when disordered. However, in addition to being relatively hard, the exterior coatings in combination with the adherence coatings of the present invention generally result in a wear resistant system having excellent adherence to the substrate. As a result, tools in accordance with the present invention have increased life and the use of such tools can result in an improved surface finish on parts machined therewith.

Adherence and exterior coatings of materials other than set forth in the foregoing examples can be made using similar techniques and appropriately choosing the target material and reactive gas, if any, in the sputtering atmosphere. Also, multiple targets of different elements or compositions could be utilized. While the foregoing examples have shown production of adherence and exterior coatings, including disordered exterior coatings by sputtering techniques, the invention is not so limited. Any method which produces the desired adherence or exterior coating can be utilized.

It is to be understood that the coatings of the present invention are not limited to applications involving tools. The invention is useful on surfaces that may be subjected to friction or wear, including, for example, and not as a limitation on the invention, bearings, engine parts, fittings, and other devices where friction or wear is encountered.

The present invention and its advantages can be more completely understood from the following examples.

EXAMPLE I

High speed steel drill bits were coated in accordance with the invention. Onto the surface of the drills was applied a sputtered adherence coating of titanium and tungsten. A hot pressed target of $Ti_{.12}W_{.88}$ was utilized to sputter the titanium-tungsten adherence coating. The thickness of the adherence coating was about 1000Å. DC magnetron sputtering was utilized with a bias voltage of $-750$ volts being initially applied to the substrate and being decreased over time to $-60$ volts in a ramp fashion.

After application of the adherence coating, a disordered molybdenum-boron coating was applied utilizing a hot pressed target having a composition $Mo_{.33}B_{.67}$. The thickness of the exterior coating was about 2.5 micrometers.

The drills with the previously described coatings lasted more than ten times as long as uncoated drills, and the adherence coating provided increased adherence of the exterior coating.

EXAMPLE II

Tungsten carbide reamer tools were coated with the same type of adherence coating and exterior coating as described in Example I. The coated reamer tools exhibited a 200% increase in lifetime compared with uncoated tools of the same type, and the adherence coating provided increased adherence of the exterior coating.

While this invention has been described in relation to its preferred embodiments, it is to be understood that various modifications thereof will be apparent to those of ordinary skill in the art upon reading this specification and it is intended to cover all such modifications as fall within the scope of the appended claims.

We claim:

1. An article comprising, in sequential order: a substrate containing material selected from the group consisting of metallic and ceramic material, a metal adherence coating applied over the substrate and a disordered exterior coating applied over the adherence coating and different from the adherence coating, said adherence coating providing good adherence of the exterior coating and said adherence coating consisting essentially of at least one or more metallic elements selected from the group consisting of scandium, titanium, vanadium, chromium, yttrium, zirconium, niobium, molybdenum, hafnium, tantalum, aluminum and tungsten, and which meets any one or more of the following provisos relative to said substrate:
   (1) at least one common element is present in said substrate and said adherence coating;
   (2) at least one element is present in said substrate and said adherence coating that has about the same atomic radius;
   (3) at least one element is present in said substrate that has a high bond energy between at least one element in said adherence coating;
   (4) at least one element of said adherence coating is soluble in said substrate; and
   (5) at least one element is present in said adherence coating that forms the same type of atomic structure as said substrate after migration therein, and which adherence coating meets any one or more of the following provisos relative to said exterior coating:
   (1) at least one common element is present in said exterior coating and said adherence coating;
   (2) at least one element is present in said exterior coating and said adherence coating that has about the same atomic radius;
   (3) at least one element is present in said exterior coating that has a high bond energy between at least one element of said adherence coating;
   (4) at least one element of said adherence coating is soluble in said exterior coating; and
   (5) at least one element is present in said adherence coating that forms the same type of atomic structure as said exterior coating after migration therein; said exterior coating comprising at least one transition metal selected from the group consisting of scandium, yttrium, zirconium, niobium, molybdenum, hafnium, tantalum, titanium, vanadium, chromium and tungsten and at least one non-metallic element selected from the group consisting of boron, carbon, nitrogen and oxygen.

2. The article of claim 1 wherein at least one element of said adherence coating is present in said substrate and in said exterior coating.

3. The article of claim 1 wherein said at least one element of said adherence coating is selected from the group consisting of scandium, titanium, vanadium, chromium, yttrium, zirconium, niobium, molybdenum, hafnium, tantalum, aluminum, tungsten and the adherence coating optionally further consists essentially of one or more materials selected from the group consisting of: a metal hydride or hydrides of the foregoing metals; a compound or compounds of hydrogen and silicon; fluorine; silicon; phosphorous; sulfur; and chlorine, said substrate containing at least one element selected from the group consisting of tungsten, silicon, titanium, aluminum and iron and said exterior coating contains at least one element selected from the group consisting of scandium, titanium, vanadium, chromium, yttrium, zirconium, niobium, molybdenum, hafnium, tantalum, tungsten, silicon, germanium, selenium, boron, carbon, nitrogen and oxygen.

4. The article of claim 3 wherein said exterior coating is at least substantially amorphous.

5. The article of claim 1 wherein said adherence coating consists essentially of at least one element selected from the group consisting of titanium, tungsten, and aluminum.

6. The article of claim 1 wherein the adherence coating is formed by sputtering.

7. The article of claim 1 wherein the exterior coating is formed by sputtering.

8. The article of claim 6 wherein said exterior coating is sputtered in a manner to provide a relatively smooth, non-columnar surface.

9. The article of claim 7 wherein said exterior coating is at least substantially amorphous.

10. The article of claim 1 wherein said adherence coating has at least a substantially columnar microstructure.

11. The article of claim 1 wherein said article is a tool.

12. The article of claim 1 wherein said substrate has an aspect ratio of from about 2 or more and said adherence coating is formed by sputtering, the initial sputtering including application of a relatively low bias voltage to said substrate for facilitating initial coverage of said substrate with said adherence coating and thereafter sputtering the adherence coating material in a manner to provide a columnar or substantially columnar microstructure.

13. The article of claim 12 wherein a sufficiently high bias voltage is applied to said substrate to produce a columnar or substantially columnar microstructure.

14. The article of claim 13 wherein said high bias voltage is from about $-1000$ to about $-2500$ volts.

15. The article of claim 1 wherein said substrate has an aspect ratio of from about 0.5 to about 2.0 and said adherence coating is formed by sputtering in a manner to produce a columnar or substantially columnar microstructure.

16. The article of claim 1 wherein said substrate has an aspect ratio of from about 0.5 to about 2.0 and said adherence coating is formed by sputtering wherein a bias voltage of from about $-500$ to about $-1000$ volts is applied to said substrate during said sputtering.

17. The article of claim 1 wherein said substrate has an aspect ratio of from about 0 to about 0.5 and said adherence coating is formed by sputtering in a manner to achieve a columnar or substantially columnar microstructure.

18. The article of claim 17 wherein a sufficiently high bias voltage is applied to the substrate to produce a columnar or substantially columnar microstructure.

19. The article of claim 18 wherein said bias voltage is from about $-1000$ to about $-2500$ volts.

20. The article of claim 1 wherein said substrate comprises tungsten carbide, said adherence coating consists essentially of tungsten and titanium and said exterior coating comprises amorphous molybdenum and boron.

21. The article of claim 20 wherein said adherence coating composition is, on an atomic basis, from about $Ti_{.05}W_{.95}$ to about $Ti_{.20}W_{.80}$.

22. The article of claim 20 wherein said adherence coating composition is, on an atomic basis, about $Ti_{.12}W_{.88}$.

23. The article of claim 20 wherein said exterior coating composition is $Mo_xB_{1-x}$, wherein "x" is less than or equal to about 0.5.

24. The coated substrate of claim 23 where "x" is equal to about 0.33.

25. The article of claim 20 wherein the adherence coating is at least substantially columnar.

26. The article of claim 1 wherein said adherence coating composition is, on an atomic basis, from about $Ti_{.05}W_{.95}$ to about $Ti_{.50}W_{.50}$.

27. The article of claim 1 wherein said exterior coating is at least substantially amorphous.

28. An article comprising:
a tungsten carbide substrate;
a titanium-tungsten adherence coating over said substrate; and
a wear-resistant disordered molybdenum-boron coating over said titanium-tungsten coating.

29. The article of claim 30 wherein the compositioin of the titanium-tungsten coating is, on an atomic basis, from about $Ti_{.05}W_{.95}$ to about $Ti_{.50}W_{.50}$.

30. The article of claim 28 wherein said titanium-tungsten coating is at least substantially columnar.

31. The article of claim 28 wherein the molybdenum-boron coating has a composition of $Mo_xB_{1-x}$ where "x" is less than or equal to 0.5.

32. The article of claim 28 wherein "x" is about 0.33.

33. The article of claim 28 wherein the coatings are formed by sputtering.

34. The article of claim 28 wherein said molybdenum-boron coating is at least substantially amorphous.

35. An article comprising:
a tool steel substrate;
a titanium-tungsten adherence coating over said substrate; and
a wear-resistant disordered molybdenum-boron coating over said titanium-tungsten coating.

36. The article of claim 35 wherein the composition of the titanium-tungsten coating is, on an atomic basis, from about $Ti_{.05}W_{.95}$ to about $Ti_{.50}W_{.50}$.

37. The article of claim 35 wherein said titanium-tungsten coating is at least substantially columnar.

38. The article of claim 35 wherein the molybdenum-boron coating has a composition of $Mo_xB_{1-x}$ where "x" is less than or equal to 0.5.

39. The article of claim 38 wherein "x" is about 0.33.

40. The article of claim 35 wherein the coatings are formed by sputtering.

41. The article of claim 35 wherein said molybdenum-boron coating is at least substantially amorphous.

42. A composite coating applied to a substrate containing material selected from the group consisting of metallic and ceramic material, comprising a metal adherence layer applied over the substrate and a disordered exterior layer applied over the adherence layer and different from said adherence layer, said adherence layer applied to the substrate for providing good adhesion of said exterior layer and consisting essentially of one or more metallic elements selected from the group consisting of scandium, titanium, vanadium, chromium, yttrium, zirconium, niobium, molybdenum, hafnium, tantalum, aluminum and tungsten, and which meets any one or more of the following provisos relative to the substrate:

(1) at least one common element is present in said substrate and said adherence coating;
(2) at least one element is present in said substrate and said adherence coating that has about the same atomic radius;
(3) at least one element is present in said substrate that has a high bond energy between at least one element in said adherence coating;
(4) at least one element of said adherence coating is soluble in said substrate; and
(5) at least one element is present in said adherence coating that forms the same type of atomic structure as said substrate after migration therein, and which adherence coating meets any one or more of the following provisos relative to said exterior coating:
(1) at least one common element is present in said exterior coating and said adherence coating;
(2) at least one element is present in said exterior coating and said adherence coating that has about the same atomic radius;
(3) at least one element is present in said exterior coating that has a high bond energy between at least one element of said adherence coating;
(4) at least one element of said adherence coating is soluble in said exterior coating; and
(5) at least one element is present in said adherence coating that forms the same type of atomic structure as said exterior coating after migration therein; said exterior coating comprising at least one transition metal selected from the group consisting of scandium, yttrium, zirconium, niobium, molybdenum, hafnium, tantalum, titanium, vanadium, chromium and tungsten and at least one non-metallic element selected from the group consisting of boron, carbon, nitrogen and oxygen.

43. The composite coating of claim 40 wherein said adherence coating has at least a substantially columnar microstructure.

44. The composite coating of claim 40 wherein said adherence coating consists essentially of two elements that are mutually soluble.

45. The composite coating of claim 40 wherein said adherence layer is formed by sputtering.

46. The composite coating of claim 40 wherein said exterior layer is formed by sputtering.

47. The composite coating of claim 40 wherein said adherence layer is sputtered in a manner to produce at least a substantially columnar microstructure.

48. The composite coating of claim 47 wherein the adherence coating is sputtered with bias voltage applied to the substrate.

49. The composite coating of claim 48 wherein the bias voltage is essentially constant.

50. The composite coating of claim 47 wherein the bias voltage is increased during sputtering of the adherence layer from a relatively low bias voltage to a relatively high bias voltage.

51. The composite coating of claim 47 wherein the bias voltage is decreased during sputtering of the adherence layer from a relatively high bias voltage to a relatively low bias voltage.

52. The composition coating of claim 42 wherein the adherence coating contains titanium and tungsten in relative amounts, on an atomic basis, of from about $Ti_{.05}W_{.95}$ to about $Ti_{.50}W_{.50}$.

53. The composite coating of claim 52 wherein the exterior coating has a composition of $Mo_xB_{1-x}$ where "x" is less than or equal to 0.5.

54. The composite coating of claim 42 wherein said exterior layer is at least substantially amorphous.

55. An article comprising, in sequential order: a substrate containing material selected from the group consisting of metallic and ceramic material, an adherence coating applied over the substrate and a disordered exterior coating applied over the adherence coating and different from the adherence coating, said adherence coating providing good adherence of the exterior coating and said adherence coating comprising silicon and which meets any one or more of the following provisos relative to said substrate:
   (1) at least one common element is present in said substrate and said adherence coating;
   (2) at least one element is present in said substrate and said adherence coating that has about the same atomic radius;
   (3) at least one element is present in said substrate that has a high bond energy between at least one element in said adherence coating.
   (4) at least one element of said adherence coating is soluble in said substrate; and
   (5) at least one element is present in said adherence coating that forms the same type of atomic structure as said substrate after migration therein, and which adherence coating meets any one or more of the following provisos relative to said exterior coating:
   (1) at least one common element is present in said exterior coating and said adherence coating;
   (2) at least one element is present in said exterior coating and said adherence coating that has about the same atomic radius;
   (3) at least one element is present in said exterior coating that has a high bond energy between at least one element of said adherence coating;
   (4) at least one element of said adherence coating is soluble in said exterior coating; and
   (5) at least one element is present in said adherence coating that forms the same type of atomic structure as said exterior coating after migration therein; said exterior coating comprising at least one transition metal selected from the group consisting of scandium, yttrium, zirconium, niobium, molybdenum, hafnium, tantalum, titanium, vanadium, chromium and tungsten and at least one non-metallic element selected from the group consisting of boron, carbon, nitrogen and oxygen.

56. The article of claim 55 wherein at least one element of said adherence coating is present in said substrate and in said exterior coating.

57. The article of claim 55 wherein said exterior coating composition contains material selected from the group consisting of germanium, germanium oxide and aluminum oxide.

58. The article of claim 55 wherein said substrate is selected from the group consisting of silicon nitride and silicon oxide.

59. The article of claim 55 wherein said adherence coating further comprises hydrogen present as a compound or compounds of silicon.

60. The article of claim 55 wherein said exterior coating is at least substantially amorphous.

* * * * *